United States Patent
Zenasni

(10) Patent No.: US 8,623,466 B2
(45) Date of Patent: Jan. 7, 2014

(54) METHOD FOR PREPARING AN ORIENTED-POROSITY DIELECTRIC MATERIAL ON A SUBSTRATE BY MEANS OF ELECTROMAGNETIC AND PHOTONIC TREATMENT

(75) Inventor: Aziz Zenasni, Gieres (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 13/367,439

(22) Filed: Feb. 7, 2012

(65) Prior Publication Data

US 2012/0135161 A1    May 31, 2012

Related U.S. Application Data

(62) Division of application No. 12/035,885, filed on Feb. 22, 2008, now Pat. No. 8,133,548.

(30) Foreign Application Priority Data

Feb. 23, 2007 (FR) .................................. 07 53451

(51) Int. Cl.
   *C23C 16/56*    (2006.01)
   *C08F 2/48*     (2006.01)
   *C08F 2/52*     (2006.01)

(52) U.S. Cl.
   USPC ............ 427/493; 427/488; 427/489; 427/490

(58) Field of Classification Search
   USPC .................. 427/488, 489, 490, 493
   See application file for complete search history.

(56) References Cited

U.S. PATENT DOCUMENTS

| 4,586,068 | A | 4/1986 | Petroff et al. |
| 6,338,975 | B1 * | 1/2002 | Yoshimura et al. ............. 438/29 |
| 6,556,339 | B2 | 4/2003 | Smith et al. |
| 7,041,910 | B2 * | 5/2006 | Swager et al. ............ 174/110 R |
| 7,208,389 | B1 * | 4/2007 | Tipton et al. .................. 438/409 |
| 2004/0096593 | A1 | 5/2004 | Lukas et al. |
| 2005/0070124 | A1 | 3/2005 | Miller et al. |
| 2005/0113472 | A1 | 5/2005 | Fillmore et al. |

FOREIGN PATENT DOCUMENTS

JP    2002-338229 A    11/2002

OTHER PUBLICATIONS

Giunta et al, Angewandte Chemie Int. Ed. 43, 2004, pp. 1505-1507.
Wu et al, J. Phys. Chem. vol. 103, 1999, XP003007058, pp. 2374-2384.

* cited by examiner

Primary Examiner — Elena T Lightfoot
(74) Attorney, Agent, or Firm — Oblon, Spivak, McClelland, Maier & Neustadt, L.L.P.

(57) ABSTRACT

Provided a method for producing an oriented-porosity dielectric material on a substrate. The method includes depositing a composite layer on a substrate by vapor deposition comprising a material forming a matrix and a compound comprising chemical groups capable of being oriented under the effect of an electromagnetic field and/or photonic radiation; treating the composite layer to obtain the cross-linking of the material forming a matrix; and subjecting the substrate coated with the composite layer to an electromagnetic field and a photonic radiation.

12 Claims, No Drawings

METHOD FOR PREPARING AN ORIENTED-POROSITY DIELECTRIC MATERIAL ON A SUBSTRATE BY MEANS OF ELECTROMAGNETIC AND PHOTONIC TREATMENT

FIELD OF THE INVENTION

The invention relates to a method for preparing an oriented-porosity dielectric material, deposited on a substrate, said material conventionally consisting of a thin layer, i.e. a layer having a thickness less than 10 µm.

In particular, the invention relates to a method for preparing an organised-porosity and low-permittivity dielectric material, i.e. generally displaying a dielectric constant k less than 3.9, and more specifically a very low permittivity material, referred to as "ultra low-k" (2.2<k<3) and "extreme low-k" (1.5<k<2.2), said material being deposited on a substrate.

This method finds applications in the field of microelectronics, particularly in the production of materials in the form of thin layers usable in interconnections in order to isolate electrically the intermetallic lines serving to carry the electric signal and prevent parasite capacitances therebetween, and to create any type of circuit making use of the separating and isolating function of thin layers.

This method also finds applications in the production of separating membranes, diffusion membranes, molecular detectors, optical materials, polymer masks.

STATE OF THE RELATED ART

The miniaturisation of microelectronic components along with the increase of the performance of same have seen considerable development in recent years. This progress has been accompanied by the development of new materials capable of replacing the materials conventionally used and wherein the properties are rendered insufficient by said miniaturisation. In particular, the need to reduce parasite capacitances between the interconnection lines incites the use of new dielectric materials displaying very low permittivity.

One of the solutions selected to date has been to use porous dielectric materials, the presence of these pores helping reduce the permittivity of the material, due to the air present therein.

For this purpose, it was particularly proposed to deposit, on areas intended to be protected by a porous dielectric material, a composite material comprising, on one hand, a dielectric material forming a matrix and, on the other hand, a compound, conventionally of the polymer type, dispersed in the matrix, and, after cross-linking of the matrix, extracting said compound so as to replace the sites occupied by same in the matrix by pores filled with air.

The compound dispersed in the matrix, wherein the only function is to enable the formation of pores within said matrix is referred to as a "pore-forming compound".

The composite material may be deposited by means of a solution process such as spin-coating and dip-coating or by means of a plasma process, such as the PECVD (Plasma Enhanced Chemical Vapour Deposition) technique.

The pore-forming compound is conventionally extracted by means of a heat treatment at a suitable temperature to obtain the decomposition of the pore-forming compound under the effect of heat and, concomitantly, the desorption thereof from the matrix. Some research also demonstrates that the use of ultraviolet irradiation combined with thermal annealing enables improved decomposition of the pore-forming compound.

However, this type of treatment, conventionally used at the present time, generates a porous material displaying amorphous and random porosity and, for this reason, high mechanical weakness. Therefore, it is difficult to incorporate this type of material in microelectronic processes requiring, for example, a chemico-mechanical polishing step, as these materials do not display a sufficient mechanical resistance.

In order to obtain a more regular porosity than the materials obtained with a polymer type pore-forming compound described above, Grosso et al. (J. Mater. Chem, 10 (2000), 2085) proposed to prepare a porous dielectric material:

by depositing on a silicon substrate by means of dip-coating of a layer of solution obtained by mixing an ethanol solution containing a silicon-based precursor: tetraethoxysilane, and a surfactant compound;

by means of heat treatment of the deposited layer so as to obtain cross-linking thereof into silica and removal of the surfactant compound.

The advantage of this method is that it makes it possible to obtain by means of a solution process a layer of porous dielectric material displaying a specific periodicity. However, this method cannot be integrated in a microelectronic integration process. In fact, in microelectronics, methods in solution are not usable as they cause adherence, mechanical resistance and thermal budget problems.

It is important to note that the prior art does not include, at the present time, any example of an embodiment of structured-porosity thin layers deposited in vapour phase (such as CVD or PECVD, in particular).

Therefore, there is a genuine need for a preparation method which makes it possible to obtain an oriented-porosity dielectric material by means of vapour phase deposition displaying a periodicity of the properties of same. In particular, there is a genuine need for a porous dielectric material, generally, in the form of a thin layer, displaying a structured, homogenous and organised porosity displaying, for this reason, a greater mechanical resistance than that of the materials obtained with the methods of the prior art and which are able to retain their physical integrity during subsequent treatments, such as chemico-mechanical polishing.

DESCRIPTION OF THE INVENTION

Therefore, the present invention relates to a method for producing an oriented-porosity dielectric material on a substrate comprising:

a) vapour phase deposition on a substrate of a composite layer, comprising a material forming a matrix and a compound comprising chemical groups capable of being oriented under the effect of an electromagnetic field and/or photonic radiation;

b) the treatment of the composite layer to obtain the cross-linking of the material forming a matrix;

said method also comprising a step c) consisting of subjecting said substrate coated with said composite layer to an electromagnetic field and/or a photonic radiation, said step c) being carried out simultaneously with step a), when said layer is subjected to a photonic radiation or carried out before and/or simultaneously with step b), when said layer is subjected to an electromagnetic field, given that the electromagnetic field is applied in contact with the substrate, said step c) being carried out so as to align the chemical groups mentioned in step a) in a predetermined direction.

In this way, the innovative nature of said method according to the invention essentially lies in the combination of step a) and step c), in that these steps will help favour an alignment of the molecules of compounds, which will be capable of being arranged in a preferred direction according to the interference applied, due to the nature of the specific chemical groups comprised by said compounds. Said compounds aligned in a preferred direction will help give the material a periodicity of the properties inherent to the nature of these compounds.

According to the invention, the step consisting of placing the substrate coated with the layer in contact with an electromagnetic field and/or a photonic radiation may be carried out in different ways.

In this way, said step c) may be performed before step b), i.e. for example, either simultaneously with the deposition step a), which is possible when the treatment is carried out by means of photonic radiation or by means of an electromagnetic field, or once the deposition step a) has been completed, which is only possible when the treatment is carried out by means of an electromagnetic field, given that it is preferable, in both cases, to implement said step c) simultaneously with the deposition step a). In fact, in the latter case, the electromagnetic field and/or the photonic radiation will enable an alignment of the molecules of compounds from the deposition thereof on the substrate and will enable a preferential arrangement thereof throughout the thickness of the deposited layer. Moreover, when step c) is carried out simultaneously with step a), the composite material is, generally, cross-linked to a low degree, which enables an improved orientation of the abovementioned compounds. For this purpose, the composite material may be deposited under mild conditions (such as a pressure P>2 torrs, a temperature less than or equal to 300° C. and a power of less than 500 Watts). For example, when the material is silica-based, more than 1% —SiOH groups should be advantageously incorporated in the layer (where it is possible to verify this content by means of infrared analysis).

As mentioned above, the treatment by means of photonic radiation may be implemented only simultaneously with the deposition step a), to enable a progressive orientation of the compounds capable of being aligned. In fact, once the layer has been deposited in the vapour phase, the photonic radiation, if applied after the deposition step, would no longer be capable of inducing an orientation of the molecules, due to the inertia of the molecules in a network subject to stress and the weak radiation-material interaction. It is also noted that a distinction is made between a photonic radiation used for degradation and the photonic radiation according to the invention, which is implemented in this case with no thermal annealing step (due to the fact that the radiation takes place simultaneously with deposition), in order to prevent the degradation of the compounds capable of being oriented during the application of the photonic radiation.

For the treatment with an electromagnetic field, said step c) may be performed simultaneously with step a), after said step a) but before step b) and/or simultaneously with said step b).

Finally, it can also be envisaged to implement step c) both before step b) and simultaneously with said step.

Irrespective of the selected alternative with respect to the time sequence of step C), the electromagnetic field applied is, advantageously, according to the invention, an electric voltage applied directly to the substrate coated with the layer. Preferentially, the electric voltage applied is a direct voltage, such that the compound molecules are arranged according to a given phase in the same irreversible manner, i.e. always in the same direction imposed by the electric field. The electric voltage, preferentially direct voltage, may be between 1 V and 100 V. It may be envisageable, depending on the nature of the compound used, to change the voltage by 1 V steps until a working point is found. The working point corresponds to the voltage for which the compound molecules are arranged in an invariable manner.

The photonic radiation may consist of ultraviolet radiation. Depending on the nature of the chemical groups of the compound capable of being oriented under the effect of UV radiation, it will be advisable to set:

the wavelength of the ultraviolet radiation, such that the groups capable of being oriented can absorb this radiation and be oriented once the absorption has been completed;

the radiation intensity such that it is in agreement with the absorption spectrum of the suitable groups of the compound.

The radiation intensity may vary, for example, between 1 and 5 eV. It may be envisageable, according to the photosensitive groups present on the compound, to vary the wavelength of the UV source gradually in order to find a working point.

The method according to the invention is applied to the preparation of an organised-porosity dielectric material, whereby the material forming a matrix will be advantageously a dielectric material and the compound comprising the chemical groups capable of being oriented under the effect of an electromagnetic field and/or a photonic radiation will be a decomposable pore-forming compound, said compound preferentially not being capable of being organised in liquid crystal form.

In this case, the method will also comprise a step d) consisting of treating the composite layer to obtain a decomposition of the pore-forming compound and the extraction thereof.

Therefore, the pores resulting from the removal of these pore-forming compounds will be oriented, in a homogeneous manner, and in a preferred direction, due to the fact that they inherit the position of the molecules of homogeneous compounds after the removal thereof.

In this case, step c) consisting of subjecting said substrate coated with said layer to a photonic radiation will always be performed simultaneously with step a).

In the case of a treatment by means of an electromagnetic field, step c) may be performed before steps b) and/or d), i.e. for example, either simultaneously with the deposition step a), or once the deposition step a) is complete, given that it is preferable to implement said step c) simultaneously with the deposition step a). In fact, in the latter case, the electromagnetic field will enable an alignment of the molecules of pore-forming compounds from the deposition thereof on the substrate and a preferential arrangement thereof throughout the thickness of the deposited layer.

In an alternative embodiment, for the treatment by means of an electromagnetic field, said step c) may be performed simultaneously with step b) and/or d).

Finally, it can also be envisaged to implement step c) both before the treatment steps b) and/or d) and simultaneously step b).

According to the invention, the dielectric material forming the matrix may be any material, preferentially silicon-based, known to display dielectric properties.

It may consist of silicon Si, $SiO_2$, SiOC, silicon carbide (SiC), hydrogenated silicon carbide (SiC:H), silicon oxynitride (Si:O:N), silicon nitride (SiN), silicon carbonitride (Si:CN), fluorinated glass (SiOF), organofluorosilicates (Si:O:C:H:F), organosilicate compounds (SiOCH), borosilicate glass (Si:OBHP), where BHP indicates boron, hydrogen, phosphorus, respectively.

It may also consist of a carbonaceous material, such as a crystallised carbon material according to the specific crystalline system for diamonds (frequently called DLC carbon).

Advantageously, the deposition may be performed by means of Plasma Enhanced Chemical Vapour Deposition (PECVD). This technique is particularly suitable when the material forming the matrix is a material of the type $SiO_2$, SiOC or SiOF.

Other methods may be used in addition to PECVD, such as high-density PECVD (ADP), photon-enhanced CVD (particularly in the case of the use of the photonic radiation for orientation), cryogenic CVD, filament-enhanced CVD.

The substrates used according to the invention may be GaAs (gallium arsenide), SiGe alloy, silicon boronitride semiconductor substrates, substrates containing silicon such as epitaxial silicon, silicon dioxide $SiO_2$, silicon carbides (SiC), SiCN, the materials SiOCH, SiOCF.

In the case of PECVD deposition, a source of dielectric material intended to form the matrix and a source of compound capable of being oriented are jointly or successively injected in the form of vapour into the confinement of a plasma reactor. In the case of precursors in liquid form, they are heated to a temperature above their boiling point beforehand. In this type of technique, the sources may be split, i.e. several sources of dielectric material and possibly several sources of compounds capable of being oriented may be used. Once the sources have been injected, a voltage is applied in the form of a difference in potential, generally between two parallel electrodes placed in a vacuum confinement, so as to generate a plasma discharge. It is specified that the term plasma refers to a gaseous medium consisting of free electrons, ions and atoms or neutral molecules, said particles being in proportions such that the medium is macroscopically neutral from en electrical point of view. The plasma initiating source may be, for example, a radiofrequency voltage. The plasma state particularly makes it possible, depending on the electromagnetic power injected, to retain or split the molecules of the precursors injected.

The molecules forming the matrix and/or the compounds capable of being oriented should be able to be injected into a vacuum plasma confinement, in vapour (gas) form. These injections may be implemented by means of various methods, such as the helium thrust method. The molecules used should advantageously have a saturating pressure value compatible with vaporisation and injection in vapour form.

A substrate, for example, made of silicon, connected to one of the electrodes, serves as a deposition substrate. The fact that said substrate is connected to an electrode makes it possible to impose a temperature on said substrate, so as to facilitate the deposition on the substrate, said temperature possibly ranging from ambient temperature to a temperature of 300° C. It may be possible to envisage increasing the temperature by 25° C. steps. Under the effect of gravitation and the diffusion of the species in the plasma, the molecules from the precursor of the matrix and the compound will be jointly adsorbed on the surface of the substrate and therefore increase the deposition.

According to the invention, the pore-forming compound deposited should comprise groups capable of being oriented under the effect of the electromagnetic field and/or a photonic radiation and, in addition, should be able to be decomposed during step d). The term decomposable refers to a compound liable to lose its physical integrity under the effect of a disturbance, for example thermal, and which may be decomposed into volatile substances, thus facilitating the extraction of same. Said pore-forming compound may advantageously be decomposed during step d) by means of a heat treatment by heating it to a temperature greater than or equal to the decomposition temperature thereof, which volatilises and extracts the pore-forming compound molecules and enables the formation of pores within the dielectric material forming the matrix. The temperature greater than or equal to the decomposition temperature of the pore-forming compound may be obtained by heating the substrate to the suitable temperature, the substrate acting as a heating plate, said heating possibly taking place either in the deposition reactor, or in an oven separate from the deposition reactor. Those skilled in the art will be able to achieve such a temperature, for example, in 25° C. steps. Besides heating on a heating plate, the thermal decomposition of the pore-forming compound may be obtained by means of exposure to radiation, mechanical energy or by means of particle irradiation.

Besides the thermal decomposition, the treatment according to step d) may be envisaged by means of solvent extraction (for example with supercritical CM or by means of chemical etching (for example by means of hydrogen plasma).

The pore-forming compound decomposed in this way diffuses outside the dielectric material forming the matrix or diffuses inside the dielectric material, forming in both cases unoccupied, empty zones, referred to as pores, which make it possible to reduce the permittivity of the dielectric material forming the matrix.

Advantageously, the molar ratio (pore-forming compound/dielectric matrix) is less than or equal to 0.5.

Advantageously, the pore-forming compound is a polymer. In this way, while decomposing, it may generate pores with a tubular structure, due to the vacant space left by the polymer chains.

As mentioned above, the pore-forming compound comprises groups capable of being oriented under the effect of an electromagnetic field, particularly an electric field, or a photonic radiation.

Groups liable to be oriented under the effect of an electromagnetic field may be polar groups that can be selected from the —OH (particularly —SiON), —CN groups, the heterocyclic groups, —$CO_2H$, esters, —SiC, —SiF, —SiNH, —CF, —NH, —F groups.

In this way, the pore-forming compound may be advantageously a polymer obtained by means of polymerisation of at least one ethylenic monomer comprising a polar group selected from:

a) ethylenic monomers comprising one or more —$CO_2H$ groups and the esters thereof and ethylene monomers comprising one or more CN groups, such as:
  (meth)acrylics, possibly substituted, such as acrylic acid, methacrylic acid or crotonic acid;
  alkyl and alkylene(meth)acrylates such as methyl, ethyl, propyl, butyl, octyl, 2-ethyl-hexyl, cyclohexyl or 2-hexene(meth)acrylates and the derivatives thereof obtained by substituting said alkyls and alkylenes such as methoxyethyl, ethoxyethyl, ethoxypropyl, hexafluoroisopropyl, 2-hydroxyethyl, 2- or 3-hydroxypropyl, 2,3-dihydroxypropyl, polyethoxyethyl or polyethoxy-propyl (meth)acrylates;
  aryl(meth)acrylates such as phenyl or benzyl(meth)acrylates, and the derivatives thereof obtained by substituting said aryls;
  poly(ethylene glycol) or poly(propylene glycol)(meth)acrylates and di(meth)acrylates;
  (meth)acrylamides and the N-substituted derivatives thereof such as N-methylacrylamide, N,N-dimethylacrylamide, N,N-dimethylmethacrylamide, 2-acrylamido-2-methyl-1-propanesulphonic acid, N-[3-(dimethylamino)propyl]acrylamide or 2-(N,N-diethylamino) ethylmethacrylamide;

unsaturated dicarboxylic acids such as maleic acid, fumaric acid or itaconic acid, and the esters thereof such as dimethyl maleate, dimethyl fumarate or diethyl fumarate;

nitrile monomers such as acrylonitrile;

b) ethylenic monomers comprising a heterocyclic group such as a pyridine cycle (for example, 2-vinylpyridine, 4-vinylpyridine, 2-methyl-5-vinylpyridine, 4-methyl-5-vinylpyridine or N-methyl-4-vinylpyridine), a piperidine cycle (for example, N-methyl-4-vinylpiperidine), an imidazole cycle (for example, 2-methyl-1-vinylimidazole), a pyrrolidone cycle (for example, N-vinyl-pyrrolidone) or a pyrroledione cycle (for example, maleimide);

c) ethylenic monomers comprising an —O—CO—R group where R represents an alkyl group (for example, vinyl acetate or vinyl propionate), or an aryl group (for example, vinyl benzoate);

d) ethylenic monomers comprising an —OR group, known as vinylethers, where R represents an alkyl group (for example, methylvinylether), said group possibly comprising one or more oxygen atoms (for example, ethoxyethyl-vinylether) or one of more amino groups (for example, dimethylaminoethylvinylether); and e) ethylenic monomers comprising a —C(O)R group where R represents an alkyl group (for example, vinylmethylketone)

and, if applicable, one or more monomers selected from:

ethylenic monomers comprising an exclusively hydrocarbonate aromatic group such as styrene or α-methylstyrene;

exclusively hydrocarboneous ethylenic monomers such as 1-hexene, norbornene or acenaphthylene.

In particular, polymers liable to form pore-forming compounds capable of being oriented under the effect of an electromagnetic field are (acrylonitrile/butadiene) copolymers, (styrene/acrylonitrile) copolymers, polyvinylpyrrolidines, cyclodextrins.

Groups liable to be oriented under the effect of a photonic radiation may be —N═N— azo groups.

Pore-forming compounds meeting this criterion are linear polymers obtained by means of photopolymerisation of monomers such as azobenzenes or cross-linked polymers obtained by means of photopolymerisation of prepolymers comprising groups liable to be cross-linked (referred to as cross-linking groups) and monomers, oligomers or polymers comprising groups capable of reacting with cross-linking groups, the resulting polymer comprising photo-orientable groups.

According to the invention, step b) and step d) may be implemented simultaneously.

The treatment step b) intended to induce the cross-linking of the dielectric material forming the matrix generally consists of a heating of the substrate to an effective temperature to induce cross-linking. It is specified that the term cross-linking refers to a reaction inducing a connection of the chains of the matrix with each other via bridges or chemical bonds, in order to form a network displaying superior physicochemical properties, such as rigidity, to the layer of material initially deposited.

Step d) is advantageously performed by heating to an effective temperature to obtain a decomposition of the pore-forming compound.

If said step b) is implemented simultaneously with step d), the heating will make it possible to decompose, concomitantly, the pore-forming compound. The heating means to cross-link the dielectric material may be similar to those described above for the decomposition of the pore-forming compound. Said heating step of the dielectric material forming the matrix with a view to cross-linking same, may be termed "annealing", where said annealing may be assisted by ultraviolet radiation, an electron beam, by means of $H_2$ plasma, in supercritical fluid (such as $CO_2$).

Step b) and step d) should be performed at an effective temperature, where said effective temperatures may be determined easily, so as to obtain the desired purpose, i.e. the cross-linking and/or decomposition of the pore-forming compound.

In particular, the temperatures will be selected, so as to obtain a stabilised material advantageously meeting the following criteria:

satisfactory ageing;

humidity absorption of less than 1% (determined by weighing);

a stable dielectric constant (deviation of less than 0.05);

a satisfactory mechanical resistance, whereby the film should not delaminate or crack during a mechano-chemical polishing step, such as mechano-chemical polishing with a basic pH colloidal silica particle-based suspension (pH of the order of 8);

a heat resistance, whereby the film should be stable up to 450° C. (loss of mass less than 5%);

a physicochemical inertia, whereby the ellipsometric and stress measurements should remain constant, and not displaying the appearance of new adsorbed bonds on the infrared spectrum over time.

All the steps are advantageously performed at a pressure greater than 5 torrs.

In this way, the method according to the invention may make it possible to obtain an organised-porosity dielectric material, particularly in the form of a thin layer, with low permittivity, i.e. generally displaying a dielectric constant k less than 3.9, and more specifically a very low permittivity material, referred to as an "ultra low-k" (2.2<k<3) and "extreme low-k" (1.5<k<2.2) material.

In addition to applications in the field of microelectronics, these materials may find applications in the field of catalysis, separating membranes, chemical sensors and optical interconnections.

DETAILED DESCRIPTION OF SPECIFIC EMBODIMENTS

Example 1

A silicon sheet is deposited on a heating substrate.

On said silicon sheet, a layer of SiOC (material forming a matrix) comprising a pore-forming compound is deposited by means of photon-assisted PECVD by injecting:

a organosilicate compound: tetraethoxysilane, a precursor of the layer of SiOC;

a pore-forming compound comprising photosensitive groups: a diarylethene according to a pore-forming compound flow rate ratio with respect to the organosilicate compound of 2.

During the deposition step, a 10 mW ultraviolet radiation at a wavelength of 325 nm is applied by irradiating the substrate coated with the layer, whereby the molecules of the pore-forming compound adsorbed on the surface of the substrate are oriented in a given direction. Finally, the substrate coated with the layer is subjected to heating at a temperature of 425° C. for 1 hour, whereby the pore-forming compound is removed and the organosilicate compound is cross-linked. In this way, a dielectric layer displaying a regularly arranged porosity is obtained.

The invention claimed is:

1. A method for producing an oriented-porosity dielectric material on a substrate, the method comprising:
   a) depositing a composite layer on a substrate by a vapor phase deposition, wherein the composite layer comprises a material forming a matrix and a compound comprising at least one chemical group capable of being oriented under the effect of an electric voltage and a photonic radiation,
   wherein the material forming a matrix is a dielectric material and the compound comprising the at least one chemical group capable of being oriented under the effect of an electric voltage and a photonic radiation is a decomposable pore-forming compound;
   b) treating the composite layer to cross-link the material, thereby forming the matrix;
   said method further comprising c) subjecting said substrate coated with said composite layer to an electric voltage and a photonic radiation, wherein said subjecting c) is carried out so as to align the chemical groups of the deposited composite layer in a predetermined direction, and
   d) treating the composite layer to obtain a decomposition of the pore-forming compound, thereby extracting the pore-forming compound.

2. The method according to claim 1, wherein said subjecting c) is carried before or simultaneously with said treating b), and wherein the electric voltage is applied in contact with the substrate.

3. The method according to claim 1, wherein the electric voltage is applied directly to the substrate coated with the layer.

4. The method according to claim 2, wherein the electric voltage is from 1 V to 100 V.

5. The method according to claim 1, wherein the dielectric material forming a matrix is a non-polymeric silicon-based material.

6. The method according to claim 5, wherein the dielectric material is at least one silicon-based material selected from the group consisting of Si, $SiO_2$, SiOC, SiOF, SiC, a hydrogenated silicon carbide, a silicon oxynitride, a silicon nitride, a silicon carbonitride, fluorinated glass, an organofluorosilicate compound, an organosilicate compound, and borosilicate glass.

7. The method according to claim 5, wherein said depositing a) is performed by a plasma enhanced chemical vapor deposition.

8. The method according to claim 1, wherein the decomposable pore-forming compound is a polymer.

9. The method according to claim 8, wherein the polymer is obtained by polymerisation of at least one ethylenic monomer comprising a polar group selected from the group consisting of:
   an ethylenic monomer comprising one or more —$CO_2H$ groups and an ester thereof;
   an ethylenic monomer comprising one or more CN groups;
   an ethylenic monomer comprising a heterocyclic group;
   an ethylenic monomer comprising an —O—CO—R group, wherein R is an alkyl group, or an aryl group;
   an ethylenic monomer comprising an —OR group, wherein R is an alkyl group, and the —OR group optionally comprises one or more oxygen atoms or one of more amino groups; and
   an ethylenic monomer comprising a —C(O)R group, wherein R is an alkyl group; and,
   optionally, one or more monomers selected from the group consisting of:
   an ethylenic monomer comprising exclusively at least one hydrocarboneous aromatic group; and
   exclusively a hydrocarboneous ethylenic monomer.

10. The method according to claim 1, wherein said treating b) is performed by heating to an effective temperature, thereby obtaining cross-linking of the material forming the matrix.

11. The method according to claim 1, wherein said treating d) is performed by heating to an effective temperature, thereby obtaining a decomposition of the pore-forming compound.

12. The method according to claim 1, wherein said treating b) and said treating d) are performed simultaneously.

* * * * *